(12) United States Patent
Beatty

(10) Patent No.: US 11,062,928 B2
(45) Date of Patent: Jul. 13, 2021

(54) PROCESS OPTIMIZATION USING DESIGN OF EXPERIMENTS AND RESPONSE SURFACE MODELS

(71) Applicant: KLA CORPORATION, Milpitas, CA (US)

(72) Inventor: Scott Beatty, Beaverton, OR (US)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 16/594,845

(22) Filed: Oct. 7, 2019

(65) Prior Publication Data

US 2021/0104423 A1    Apr. 8, 2021

(51) Int. Cl.
| | |
|---|---|
| H01L 21/67 | (2006.01) |
| G06Q 10/06 | (2012.01) |
| G06K 9/52 | (2006.01) |
| G06T 7/60 | (2017.01) |
| G06T 7/00 | (2017.01) |
| G05B 19/418 | (2006.01) |

(52) U.S. Cl.
CPC ......... *H01L 21/67276* (2013.01); *G06K 9/52* (2013.01); *G06Q 10/06* (2013.01); *G06T 7/001* (2013.01); *G06T 7/60* (2013.01); *G05B 19/41875* (2013.01); *G05B 2219/32368* (2013.01)

(58) Field of Classification Search
CPC .... G05B 19/41875; G05B 2219/32368; G06Q 10/06; G06T 7/001; H04N 5/225
See application file for complete search history.

(56) References Cited

U.S. PATENT DOCUMENTS

| | | |
|---|---|---|
| 7,580,767 B2 | 8/2009 | MacDonald et al. |
| 8,805,630 B2 | 8/2014 | Lin |
| 8,924,877 B2 | 12/2014 | Foslien et al. |
| 9,857,291 B2 | 1/2018 | Kwak et al. |
| 10,101,670 B2 | 10/2018 | Pandev et al. |
| 2005/0246044 A1 | 11/2005 | Conrad et al. |
| 2005/0267607 A1 | 12/2005 | Paik |
| 2006/0009872 A1 | 1/2006 | Prager et al. |
| 2006/0064280 A1 | 3/2006 | Vuong et al. |
| 2006/0265162 A1 | 11/2006 | Muro et al. |
| 2013/0035888 A1 | 2/2013 | Kandel et al. |
| 2013/0202175 A1* | 8/2013 | Lee ................. A61B 8/0875 382/131 |

(Continued)

FOREIGN PATENT DOCUMENTS

| | | |
|---|---|---|
| KR | 20130111555 A | 10/2013 |
| WO | 2013066767 A1 | 5/2013 |

OTHER PUBLICATIONS

Myers et al., "Two-Level Factorial Designs," Response Surface Methodology—Process and Product Optimization using designed experiments, Wiley Publishing, 4th edition, 2016, 7 pages.

(Continued)

*Primary Examiner* — Seahvosh Nikmanesh
(74) *Attorney, Agent, or Firm* — Hodgson Russ LLP

(57) ABSTRACT

Using measurements from a metrology tool, combinations of tool settings on the metrology tool can be determined. Candidates can then be determined and a response surface model can be generated for each of the candidates. A list of the candidates of the tool settings that provide a maximum response and that are least sensitive to sources of noise can then be determined from the response surface models. The list of the candidates can each be from a denser region of the response surface model.

17 Claims, 10 Drawing Sheets

(56) References Cited

U.S. PATENT DOCUMENTS

| | | | |
|---|---|---|---|
| 2014/0214192 A1 | 7/2014 | Juang et al. | |
| 2014/0321709 A1* | 10/2014 | Kasahara | H04N 5/2353 382/103 |
| 2015/0253373 A1 | 9/2015 | Callegari et al. | |
| 2016/0117812 A1* | 4/2016 | Pandev | G06K 9/4604 382/149 |
| 2016/0117847 A1* | 4/2016 | Pandev | G06T 7/33 348/87 |
| 2016/0282105 A1 | 9/2016 | Pandev | |
| 2016/0313658 A1 | 10/2016 | Marciano et al. | |
| 2019/0074227 A1 | 3/2019 | Peled et al. | |

OTHER PUBLICATIONS

Montgomery, "Chapter 11: Response Surface Methods and Designs," Design and Analysis of Experiments, 8th edition, Wiley Publishing, 2013, pp. 478-553.

"Response surface model example," NIST-SEMATECH e-Handbook of Statistical Methods, retrieved from the internet Oct. 2019, <https://www.itl.nist.gov/div898/handbook/index.htm>, 10 pages.

WIPO, ISR for PCT/US2019/062308, dated Mar. 12, 2020.

Sibalija et al., "Novel approach to multi-response optimisation for correlated responses." FME Transactions, vol. 38, Issue 1, pp. 39-48, 2010.

Sadati et al., "Observational data-driven modeling and optimization of manufacturing processes." Expert Systems with Applications, EVol. 93, pp. 456-464, Mar. 1, 2018.

Boning & Chung, "Statistical Metrology—Measurement and Modeling of Variation for Advanced Process Development and Design Rule Generation." AIP conference proceedings, vol. 449, Issue 1, p. 395-404, 1998.

* cited by examiner

| Type III Tests of Fixed Effects | | | | |
|---|---|---|---|---|
| Effect | Num DF | Den DF | F Value | Pr > F |
| A | 2 | 18 | 2144.35 | <.0001 |
| B | 2 | 18 | 1134.78 | <.0001 |
| C | 1 | 18 | 1.61 | 0.2204 |
| A*B | 4 | 18 | 10.10 | 0.0002 |
| A*C | 2 | 18 | 35.03 | <.0001 |
| A*B*C | 4 | 18 | 3.10 | 0.0417 |
| D | 5 | 15222 | 1188.24 | <.0001 |
| E | 5 | 15222 | 1338.91 | <.0001 |
| A*D | 10 | 15222 | 54.40 | <.0001 |
| A*E | 10 | 15222 | 23.08 | <.0001 |
| B*D | 10 | 15222 | 17.15 | <.0001 |
| B*E | 10 | 15222 | 65.58 | <.0001 |
| C*D | 5 | 15222 | 13.63 | <.0001 |
| C*E | 25 | 15222 | 41.11 | <.0001 |
| A*B*D | 20 | 15222 | 4.29 | <.0001 |
| A*C*E | 10 | 15222 | 25.48 | <.0001 |
| A*B*E | 20 | 15222 | 3.70 | <.0001 |
| A*D*E | 50 | 15222 | 3.09 | <.0001 |
| B*C*D | 10 | 15222 | 2.26 | 0.0124 |
| B*D*E | 50 | 15222 | 11.68 | <.0001 |
| C*D*E | 30 | 15222 | 2.16 | 0.0002 |
| A*B*D*E | 20 | 15222 | 3.11 | <.0001 |

Four 3-way significant interactions involving focus

The only significant 4-way interaction

FIG. 5

| Tukey-Kramer Grouping for A*B*C*D Least Squares Means (Alpha=0.05) |||||||||||||
|---|---|---|---|---|---|---|---|---|---|---|---|---|
| LS-means with the same letter are not significantly different. |||||||||||||
| A | B | C | D | Estimate | | | | | | A | | |
| SB3 | Low | Un | 1 | 0.8156 | | | | | | A | | |
| | | | | | | | | | | A | | |
| SB3 | Low | Un | 3 | 0.8048 | | | | | B | A | | |
| | | | | | | | | | B | A | | |
| SB3 | Low | S | 1 | 0.7876 | | | | | B | A | | |
| | | | | | | | | | B | A | | |
| SB3 | Low | S | 3 | 0.7714 | | | | | B | A | C | |
| | | | | | | | | | B | A | C | |
| SB2 | Low | S | 1 | 0.7705 | | | | | B | A | C | |
| | | | | | | | | | B | | A | C |
| SB2 | Low | Un | 1 | 0.7514 | | | | | B | D | A | C |
| | | | | | | | | | B | D | | C |
| SB3 | Mid | Un | 1 | 0.7332 | | | | | B | D | E | C |
| | | | | | | | | | B | D | E | C |
| SB2 | Low | Un | 3 | 0.7284 | | | | | B | D | E | C |
| | | | | | | | | | B | D | E | C |
| SB3 | Mid | Un | 3 | 0.7271 | | | | | B | D | E | C |
| | | | | | | | | | | D | E | C |

FIG. 6B

X axis:

The SAS System

The RSREG Procedure

Canonical Analysis of Response Surface Based on Coded Data

Direction=X

|   | Critical Value | |
|---|---|---|
|   | Coded | Uncoded |
| E | 0.201048 | 5.201048 |
| D | 0.359212 | 5379.605842 |
| Predicted value at stationary point: | | |
| 0.673320 | | |

|  | Eigenvectors | |
|---|---|---|
| Eigenvalues | E | D |
| -0.040072 | 0.992090 | 0.125527 |
| -0.160619 | -0.125527 | 0.992090 |
| Stationary point is a maximum. | | |

Y axis:

The SAS System

The RSREG Procedure

Canonical Analysis of Response Surface Based on Coded Data

Direction=Y

|   | Critical Value | |
|---|---|---|
|   | Coded | Uncoded |
| E | 0.51501 | 5.51501 |
| D | 0.435574 | 5417.78702 |
| Predicted value at stationary point: | | |
| 0.673865 | | |

|  | Eigenvectors | |
|---|---|---|
| Eigenvalues | E | D |
| -0.031020 | 0.982073 | 0.188499 |
| -0.144526 | -0.188499 | 0.982073 |
| Stationary point is a maximum. | | |

FIG. 7A

PROCESS OPTIMIZATION USING DESIGN OF EXPERIMENTS AND RESPONSE SURFACE MODELS

FIELD OF THE DISCLOSURE

This disclosure relates to process optimization and, more particularly, to process optimization for semiconductor manufacturing.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Metrology processes are also used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Complex process optimization efforts are used by semiconductor manufacturers to meet the increasing demand for tighter tolerances. For example, inspection and metrology systems or operations can be optimized. Semiconductor manufacturers generally search for an optimal set of equipment conditions that provides accurate measurements and is robust to uncontrollable or unknown sources of variability. Many semiconductor manufacturers seek low time-to-results with high accuracy.

Many metrology and inspection tools have a large number of adjustable settings that need to be optimized in order to get the best performance from the tool. This presents a challenge when setting up a metrology or inspection tool because of the large parameter space that must be investigated. In addition, if the films and structures on incoming wafers drift over time, the optimal recipe settings may drift and require re-optimization.

Previously, the "brute force method" varied every tool setting over its available range. For discrete settings (e.g., unpolarized, s-polarized, or p-polarized illumination), every permutation was tested. For continuous settings (e.g., focal position), the full usable range can be discretized by selecting a step size. The total number of required experiments could be unreasonably large. Additionally, current brute force methods are not able to account for inherent process variability.

Therefore, new process optimization techniques and systems are needed.

BRIEF SUMMARY OF THE DISCLOSURE

A metrology tool is provided in a first embodiment. The metrology tool comprises an energy source that generates a beam, a stage that secures a wafer in a path of the beam from the energy source, a detector, and a processor in electronic communication with the detector. The processor is configured to: receive a plurality of measurements; determine a plurality of combinations of tool settings on the metrology tool using analysis of variance (ANOVA); determine candidates from the plurality of combinations; generate a response surface model for each of the candidates; and determine a list of the candidates of the tool settings that provide a maximum response and are least sensitive to sources of noise. Each of the candidates on the list of the candidates is each from a denser region of the response surface model.

The processor can be further configured to send instructions to perform the measurements on a semiconductor wafer using the metrology tool. The measurements may be collected with a mixed effects model.

Tunable settings on the metrology tool can be independent variables.

The list of candidates can provide improved performance of the metrology tool relative to a remainder of the candidates.

The processor can be further configured to determine a score based on measurement quality.

The response surface model can be a 3×3 response surface model.

The processor can be further configured to adjust one or more settings on the metrology tool based on the list of candidates.

A method is provided in a second embodiment. The method comprises receiving a plurality of measurements from a metrology tool at a processor. Using the processor, a plurality of combinations of tool settings on the metrology tool are determined using ANOVA. Using a processor, candidates from the plurality of combinations are determined. Using the processor, a response surface model is generated for each of the candidates. Using the processor, a list of the candidates of the tool settings that provide a maximum response and are least sensitive to sources of noise are determined. Each of the candidates on list of the candidates is each from a denser region of the response surface model.

The method can further comprise performing the measurements on a semiconductor wafer using the metrology tool. The measurements may be collected with a mixed effects model.

Tunable settings on the metrology tool can be independent variables.

The list of candidates can provide improved performance of the metrology tool relative to a remainder of the candidates.

The method can further comprise determining a score based on measurement quality.

The response surface model can be a 3×3 response surface model.

The method can further comprise adjusting, using the processor, one or more settings on the metrology tool using the list of candidates.

A non-transitory computer readable medium storing a program can be configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which:

FIG. 5 is a table of an exemplary Type III test of fixed effects;

FIGS. 6A-6B illustrate 4-way interaction;

FIGS. 7A-7C illustrate exemplary response surfaces for a top recipe candidate.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

A process optimization technique for metrology systems is disclosed. This technique is accurate, verifiable, and resulted in a reduction in cost (i.e., time-to-results). To accomplish this, a designed experiment (DOE) was constructed to contrast difference and determine candidate regions of interest from the full response surface where a set of optical responses can be optimized. When candidate setup conditions have been identified, response surface methodology is utilized to interpolate points of optimal and stable response for the validation phase. A validation phase can use dense wafer sampling and success criteria can be based on meeting targeted residuals |m|+3sigma of, for example, less than 4 nm. Target success criteria were achieved while reducing the time-to-results by over 93% in one example.

With the addition of precise tunability for new metrology tools, complex process optimization efforts may be needed to meet the increasing demand for tighter tolerances. The metrology tools should perform precise measurements consistently and in adverse process conditions. An optimal set of equipment conditions are needed that will be robust to uncontrollable or unknown sources of variability. The techniques disclosed herein can provide such equipment conditions. These techniques also are robust to different semiconductor manufacturers, each of which has its own specific requirements. These techniques also address a multiple response problem where the results contain several responses designed to assess the metrology tool's ability to measure accurately and consistently.

Figure 1:
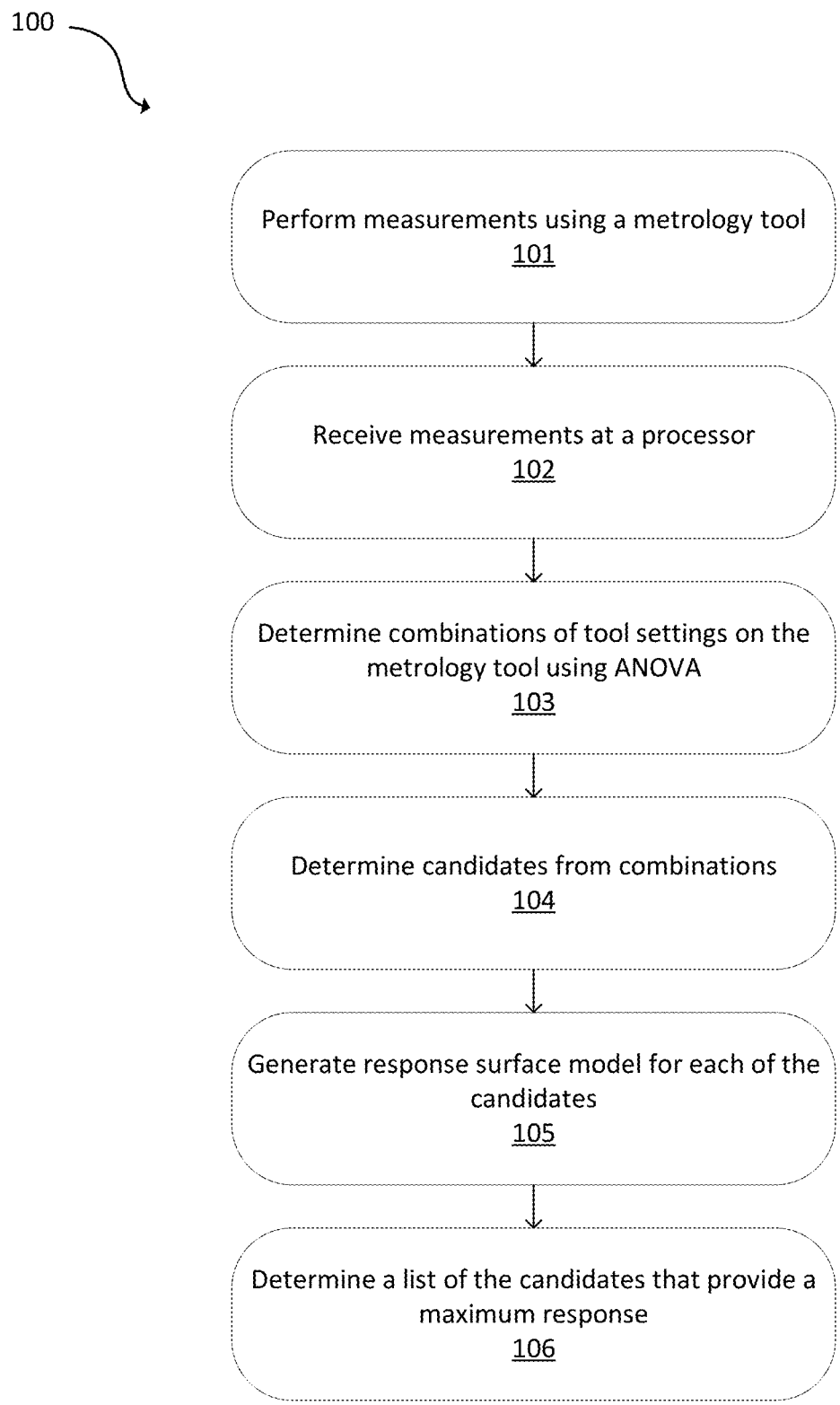
FIG. 1 is a flowchart of a method embodiment in accordance with the present disclosure.

FIG. 1 is a flowchart of a method 100. Some of all of the steps in the method 100 can be performed using a processor. A mixed effects model can be used to determine which combination of equipment settings will be robust to process variations. Modeled results can provide information that provides confidence in future measurements. Each measurement may be different, but, for example, a model that provides us with a less than 1% chance of being incorrect when new wafers are measured using those conditions can be determined. The experiment can be constructed to ensure all tool settings are assessed independently. In addition, tool settings can be included as fixed effects and sources of noise can be included as the random effects. Therefore, this can be a mixed model. Including known but uncontrollable sources of variation into the model, effects from random factors can be blocked and metrology tool settings can be assessed independently of the noise.

Measurements are performed on a semiconductor wafer using a metrology tool at 101. This step 101 may be performed separately from the other steps. Thus, results can be sent to a processor from a separate metrology tool or can be sent to the metrology tool's processor. The measurements can be collected with a mixed effects model. An appropriate Design of Experiment (DOE) can be selected such that the maximum information is extracted with a reasonable number of experiments (i.e., measurements). Example DOE types include split plot designs, orthogonal inner/outer arrays, or fractional factorials. Other DOE types can be used.

While a metrology tool is mentioned, an inspection tool or other types of tools can be used. The method 100 can work on any equipment with any combination of discreet and/or continuous variable settings.

The measurements from the metrology tool are received at a processor at 102. Combinations of tool settings on the metrology tool are determined using analysis of variance (ANOVA) at 103. Tool settings can include mark design, aperture settings, polarization settings, illumination bandwidth, wavelength, focus, or other tool settings. ANOVA can be used as a screening process so that insignificant parameters can be ignored. This results in a smaller problem to be solved. Other techniques besides ANOVA also can be used at step 103.

Candidates from the combinations are determined at 104. ANOVA can determine the most robust categorical settings before measuring combinations of continuous variables. In the case of no continuous variables, ANOVA can determine the best settings per semiconductor layer. Each layer may be unique and may require individual settings. ANOVA can provide specific combination of settings and provide confidence for future measurements. After the mixed effects model is fit, tests of statistical significance can be calculated for each main effect and each interaction effect. For the statistically significant parameters, the top-ranking combinations can be determined, such as at step 104.

A response surface model is generated for each of the candidates at 105. In an instance, the method 100 examines individual local maxima in a larger response surface and expands the DOE until curvature is detected in the response. This can provide more accurate predictions. Prior knowledge about which settings produce the desired results are needed in a typical manufacturing process. However, the semiconductor industry can have chemical and optical considerations that are unique to each individual process step and prior knowledge is generally not available.

In an example, the response surface model may be a 3×3 response surface model. Tunable settings on the metrology tool can include wavelength or focus.

A response surface method can be used to efficiently sample the response of continuous independent variables with a small number of experimental tests, and then determine the best settings by fitting a simple, smooth function (such as a linear of quadratic fit) to this experimental dataset. This approach helps reduce the number of experiments required. A response surface model can be based on peaks, which can be the regions of interest. Peaks can be extracted from the landscape.

In an instance, a response surface model can be generated from a nine point DOE (e.g., a 3×3 response surface model). Nine points can cover a region with no curvature on its landscape. A nine point DOE also can be designed to fit a quadratic model.

A local optimization can be performed over the statistically significant variables for the top ranking recipes using the initial data. Regions of interest can be located for this local optimization. Response surface methodology can be applied to the top candidates (secondary equipment settings), with the primary (tunable) settings as independent variables. This can provide a predicted set of equipment settings that may or may not have actually been measured. The method 100 can predict a set of optimal equipment settings.

A response surface model can determine: maximum interpolated response location, response surface shape, sensitivity to wavelength and focus changes, and/or fit diagnostics to determine adequacy of a model. A quadratic response surface model can be fit in a region. The response can be interpolated within the DOE space by running the response surface methodology (RSM) model which provides a fit equation. A new response can be predicted to within a level of error. Trusted candidates within, for example, a 5% margin of error may be selected. RSM modeling is two models in one: quadratic fitting and canonical modeling. Canonical modeling provides eigenvalues that determine the directions of the largest variability. Two eigenvalues can be obtained for a quadratic model. If both eigenvalues are negative, then a region of maximum response has been found. If both eigenvalues are positive, an area of minimum response has been found. If the signs of the eigenvalues are mixed, a saddle shape (the response increases in one direction and decreases in a different direction) has been found. Sensitivities can be determined by the fit equation and the fit equation can be used to model the predicted response change in a one unit change to the continuous variable. Fit diagnostics (p-values) can provide a level of confidence that a quadratic model is actually appropriate. If the fit diagnostics are poor (e.g., p-values>0.05), a determination can be made that a particular model coefficient was not needed. Fit diagnostics can be used to test for curvature.

In an embodiment, the area of the response surface model where attention should be focused is not known. It may not be possible to monitor the same region on every response surface model because the response surface models can be different.

A list of the candidates of the tool settings that provide a maximum response and are least sensitive to sources of noise is determined at 106. This determination can use ANOVA and RSM modeling as described herein. Each of the candidates on list of the candidates is from a denser region of the response surface model. In an example, the entire region in wavelength and focus from the minimum to the maximum in each variable is measured. SPOC allows interpolation and the number of points to be measured can be reduced by over 75% still using the entire range. This can be considered the dense region, though other reductions are possible for the dense region.

The list of candidates also can provide improved performance of the metrology tool relative to a remainder of the candidates. In an instance, any process change (such as photoresist thickness) can shift the best wavelength needed. SPOC can provide a solution where a 10 nm wavelength change does not alter the predicted response or the effect of a process change is minimized.

Thus, an experimental design can be constructed that is centered at the predicted equipment settings found in step 105. A denser region can be explored around the chosen candidate to determine the equipment settings that can deliver improved quality and which are least sensitive to sources of noise. Exploring around a chosen candidate and determining equipment settings can be performed simultaneously. One or more of the equipment settings on a metrology tool (or other tool) can be changed based on the results of the method 100.

The design of method 100 can use the full response space and detects regions of interest to run traditional response surface models.

The metrology tool can be monitored and controlled over time after the candidates that provide a maximum response are determined. A metrology tool may drift over time or the thickness of a wafer can change, which will result in changes of the response surface model.

Metrology tools may never run identical experiments. Embodiments of the method 100 provide a way to detect and adapt to the changes. The mathematical model can be modified automatically on a case-by-case basis. Visual aids for semiconductor manufacturers can also adapt to each unique experiment.

In an instance, a semiconductor manufacturer designs targets on a wafer. Depending on physics, certain combinations of settings may not be best for a particular target on the wafer.

Figure 2:
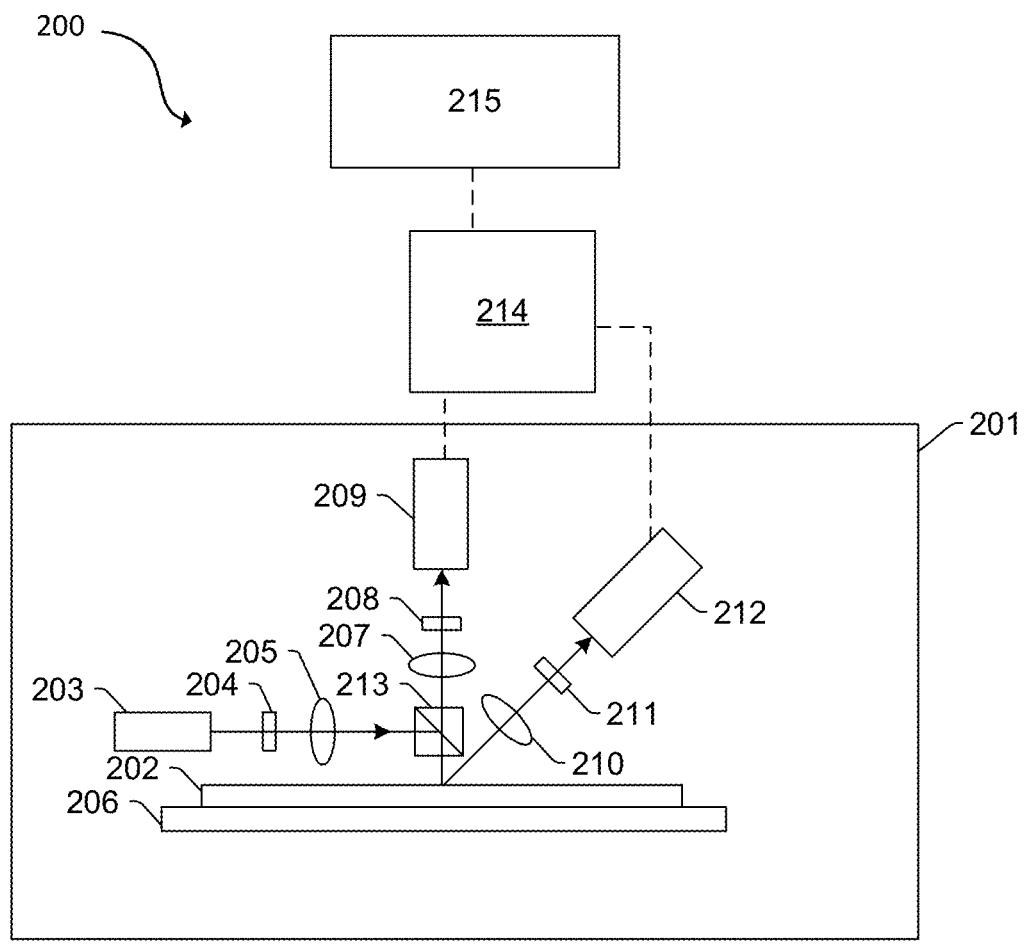
FIG. 2 is a block diagram of a metrology system embodiment in accordance with the present disclosure.

One embodiment of a metrology system that can use the method 100 is shown in the system 200 of FIG. 2. The system 200 includes optical based subsystem 201. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen includes a reticle. The reticle may include any reticle known in the art.

In the embodiment of the system 200 shown in FIG. 2, optical based subsystem 201 includes an illumination subsystem configured to direct light to specimen 202. The illumination subsystem includes at least one light source. For example, as shown in FIG. 2, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 2, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 2. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 2 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 2) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 2 as a single refractive optical element, it is to be understood that, in practice, lens 205 may include a number of refractive and/or reflective optical elements that in combination focus the light from the optical element to the specimen. The illumination subsystem shown in FIG. 2 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 2 includes two detection channels, one formed by collector 207, element 208, and detector 209 and another formed by collector 210, element 211, and detector 212. As shown in FIG. 2, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light).

As further shown in FIG. 2, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 2 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 2 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 2 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 2 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with an SEM.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 is configured to receive a plurality of measurements; determine a plurality of combinations of tool settings on the metrology tool using ANOVA; determine candidates from the plurality of combinations; generate a response surface model for each of the candidates; and determine a list of the candidates of the tool settings that provide a maximum response and are least sensitive to sources of noise. Each of the candidates on list of the candidates is each from a denser region of the response surface model. The list of candidates can provide improved performance of the metrology tool relative to a remainder of the candidates. The candidates for the response surface model can be secondary equipment settings on the metrology tool and tunable settings on the metrology tool can be independent variables. The response surface model may be a 3×3 response surface model.

The processor can be further configured to send instructions to perform the measurements on a semiconductor wafer using the metrology tool. The measurements can be collected with a mixed effects model.

The processor 214 can be further configured to determine a score based on measurement quality. A composite desirability approach can be used to deconvolute a situation where each measured attribute has different units and different variation. Composite desirability can transform each measured value to a score between 0 and 1. Additive, multiplicative, or geometric means can be used to combine all measured quality attributes into a single score.

An additional embodiment relates to a non-transitory computer-readable medium storing program instructions executable on a controller for performing a computer-implemented method for process optimization, as disclosed herein. In particular, as shown in FIG. 2, electronic data storage unit 215 or other storage medium may contain non-transitory computer-readable medium that includes program instructions executable on the processor 214. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

While disclosed with a beam of light, embodiments disclosed herein can be used with other beams from an energy source such as electron beams or ion beams.

An experiment was performed to determine a set of equipment settings that provide the most accurate measurements based on several optical quality metrics. During a validation phase, an objective was measured to determine how well a current printed layer is overlaid on top of the previous printed layer, which is referred to as overlay. Precise accuracy may be required so that, with enough points measured across the wafer, systematic spatial signatures can be removed and can be converted to a set of corrections for the lithography scanners to use for any future wafers using the same process. A targeted benchmark is to achieve overlay residuals below a semiconductor manufacturer's target for |mean|+3sigma (≤4 nm on product overlay). Residual calculations utilize a specific model determined in a semiconductor manufacturer's production facility.

Overlay residuals cannot be entered as a response in the initial experiment because it would require many (e.g., more than 100) locations to be measured across the wafer to obtain residuals based on a high order polynomial model. With replication, measuring just 100 sites across the wafer in the first phase of experimentation would result in a designed experiment with a minimum of 437,400 runs. Therefore, a set of equipment settings that will measure overlay accurately based on the optical quality metrics was determined.

Our initial experiment was arranged to assess the effect of "Factor A," "Factor B," "Factor C," "Factor D," and "Factor E" on three optical quality metrics ("Response 1," "Response 3," and "Response 2"). "Factor A" designs of interest were SB1, SB2, and SB3. "Factor B" settings of interest were Low, Mid, High. "Factor C" states of interest were P, S and Un. "Factor D" settings of interest are discreet values and "Factor E" levels of interest are in the range from −2400 to 2400. "Factor A," "Factor B," and "Factor C" were held constant while a location on the wafer was measured. "Factor D" and "Factor E" were varied. This is partly due to the number of randomized runs required and partly due to the difficulty of changing "Factor A," "Factor B," and "Factor C."

The treatment design suggests a split-plot design. Split-plot designs are applicable to many situations where difficult to change factors are applied to larger experimental units (e.g., wafers) and easy to change factors are applied at smaller sub-experimental units (e.g., sites on wafer).

Three nuisance sources of variation were identified and were included in the model. Three "Factor F" (In, Mid, Out), two directions (vertical (x) and horizontal (y)), and two orientations (right and left) make up the three random factors. Ideally, all elements exhibit the same quality when measured but optical proximity effects exist, and all sources of variability must be accounted for in the model. "Factor A" design is one of the main factors and an objective is to choose a "Factor A" design that exhibits minimal optical proximity effects. Blocking for these random sources of variation in the model is a useful technique to account for these random sources of variation.

The two subplot treatment factors ("Factor D" and "Factor E") form a response surface. The brute force method was to generate a 41×32 response surface (1312 runs) for each main plot treatment combination. It was determined through experimentation using previous data that any 41×32 response surface can be divided into 9^12 treatment combinations and still maintain the overall structure of the response surface.

Figure 3:
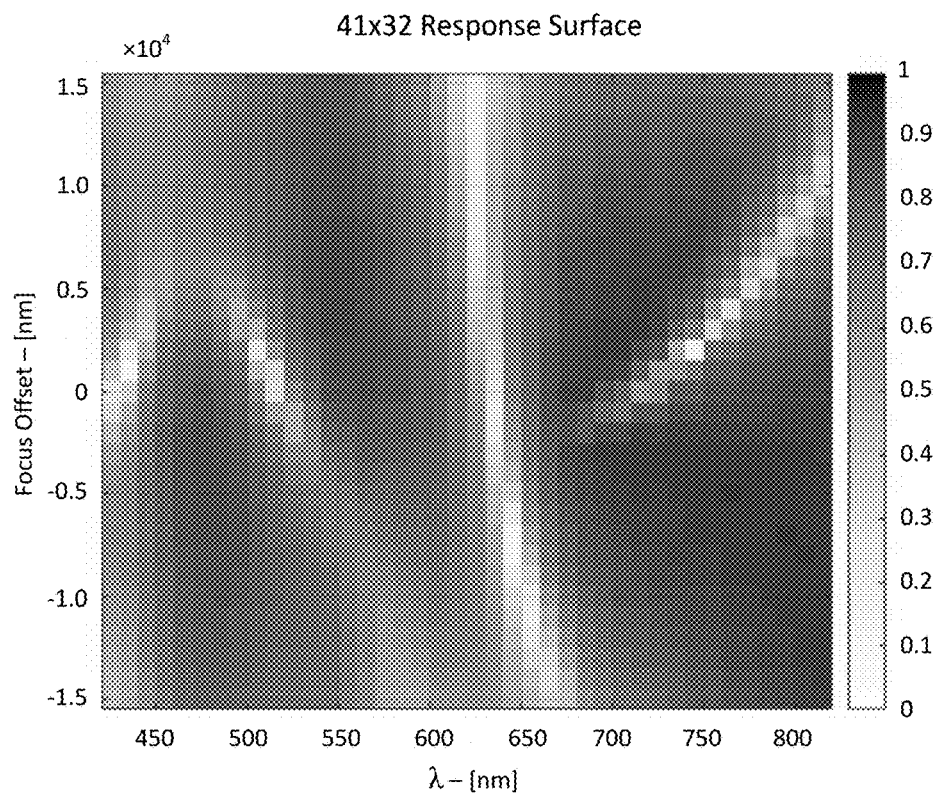
FIG. 3 is an exemplary 41×32 response surface.
Figure 4:
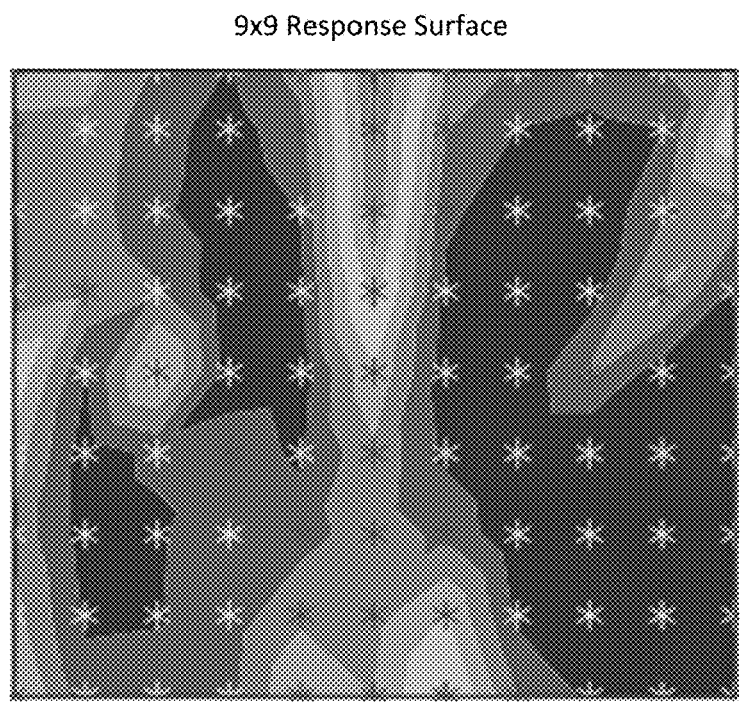
FIG. 4 is an exemplary 9×9 response surface.

As shown in FIG. 3 and FIG. 4, measuring a 9^2 grid of points instead of a 41×32 grid of points (93% reduction in number of runs required) maintains the overall structure of the response surface as approximated by a contour plot. Regions of interest can be identified for further study or validation. Through an iterative approach, it was determined that a 9×9 grid was sufficient to capture regions of interest while reducing measurement cost by almost 96%.

In the semiconductor industry, all possible regions of interest (areas of maximum response) likely should be identified for possible investigations. Therefore, a non-standard 9^2 was chosen for the subplot treatment design.

The initial experiment focused on first generating the split-plot model and evaluating the significant effects and interactions to determine candidates for response surface modeling. Three to five candidate recipes were chosen to receive a quadratic response surface model in a 3^2 face-centered composite design centered on the specific candidate's "Factor D" and "Factor E." The initial 9^2 response surface contains the points needed for the central composite face centered response surface model.

There are three responses ("Response 2," "Response 1," "Response 3"). An objective is to optimize for all responses and treat all responses equally or weighted individually depending on subject matter expertise.

In the desirability approach to multiple responses, individual responses are first normalized to composite score values that range from 0 to 1 where 1 is the ideal composite score value. The function applied depends on the response goal (maximize, minimize or target). The desirability methods are useful in the semiconductor industry where predetermined specification limits can be used as thresholds in the calculations. Lower and upper specification limits can be set based on best known methods or semiconductor manufacturer operating requirements. For example, if measuring a response where the goal is to minimize the response and it is known that any values above a threshold of 10 μm should not be considered as acceptable, the desirability equations can be configured to give a quality score of zero for all conditions where the threshold value was met or exceeded. This can assist in the semiconductor industry where the precise physics behind measurements are understood and limits have been established. Additionally, weightings can be applied if there is sufficient evidence or prior knowledge that some responses are more important than others.

After each individual desirability score is determined, a composite desirability score was calculated using a geometric means method. Once a single composite response (d_c) was generated for the model it served as the response for both the split plot analysis and for a response surface model.

A statistical linear effects model was constructed based on the design. A linear effects model is one where the response is a function of linear components of the individual effects. Effects are either controllable factors, interactions between controllable factors, or random but known sources of variation.

The type III tests of a fixed effects (reduced model) are shown in FIG. 5. This output is standard output for the mixed model GLIMMIX procedure in SAS and provides F-test statistics and p-values that help us to understand which combinations of equipment settings are important. A GLIMMIX procedure fits statistical models to data with correlations or non-constant variability and where the response is not necessarily normally distributed. These models are known as generalized linear mixed models (GLMM).

After identification of combinations of factors that are important, the outputs from least square means can be used to determine specific settings of each factor. Least square means is similar to traditional averaging, but when the number of observations in a DOE are not equal across different levels. Least square means can provide a correction for unbalanced designs. If the design is balanced (i.e., has the same number of observations across levels) then the least square means equals the average.

Figure 6A:
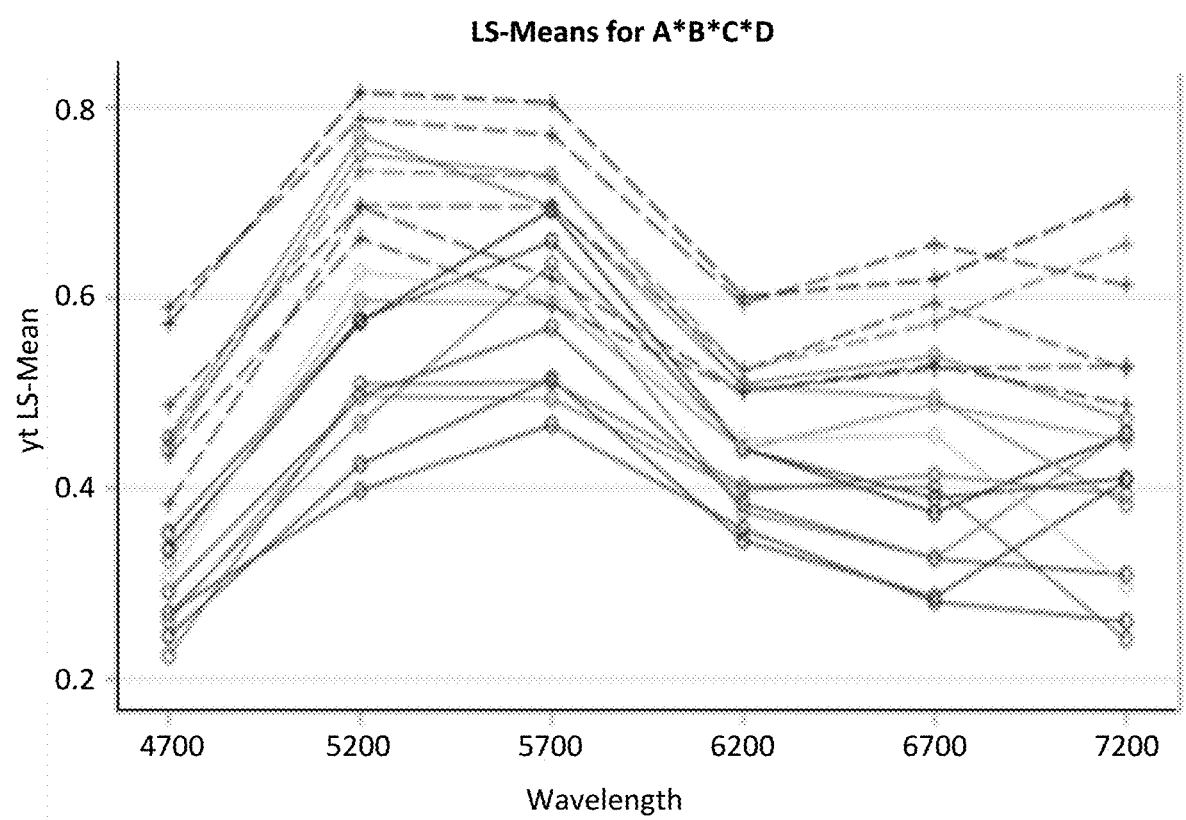

The highest order significant interaction effect is "Factor A"*"Factor B"*"Factor C"*"Factor D" (shown in FIG. 6A-^B). The least squares means (LSMeans) analysis on the interaction effect identified different contrasts and identified which sets of treatment combination levels are statistically the same. However, to determine "Factor E" settings, the four three-way interaction effects that include "Factor E" were investigated.

Upon inspection of the connecting letters report, and based on the observed data, six setups are not significantly different from each other and can be considered for further study. All six similar setups with the "A" designation contain a single "Factor B" setting (Low). "Factor A" designs SB3 and SB2 as well as "Factor D" are also dominant in the 4-way interaction evaluation.

There are four 3-way interaction effects that include "Factor E". Graphical interpretations were not helpful on these interaction plots but the connecting letters reports provide the comparisons between levels that were needed.

The connecting letters reports for the four 3-way interaction plots involving "Factor E" suggested testing the following configurations.

| Setup Rank | A | B | C | D | E |
|---|---|---|---|---|---|
| 1 | SB3 | Low | Un | 1 | 5 |
| 2 | SB3 | Low | Un | 3 | 6 |
| 3 | SB3 | Low | S | 1 | 5 |

After candidates were identified, a quadratic response surface model was run on a smaller area of the full response surface using 3^2 points subset from the 9^2 "Factor D" and "Factor E" measurements and centered around the candidates "Factor D" and "Factor E." Proceeding with validation measurements required that several criteria be met. First, a lack of fit test determines if a quadratic model is appropriate. Second, the response surface contains a local maximum if the above two conditions are met. Third, a stationary response point can be calculated (FIGS. 7A-7C).

This point of optimal response is an interpolated point that needs to be tested and validated. Collecting the response surface data as a 9^2 factorial provides a 3^2 face centered response surface model centered around the "Factor D" and "Factor E" of each candidate without further data collection. Information can be obtained from fitting a quadratic response surface in a statistical software package.

Figure 7B:
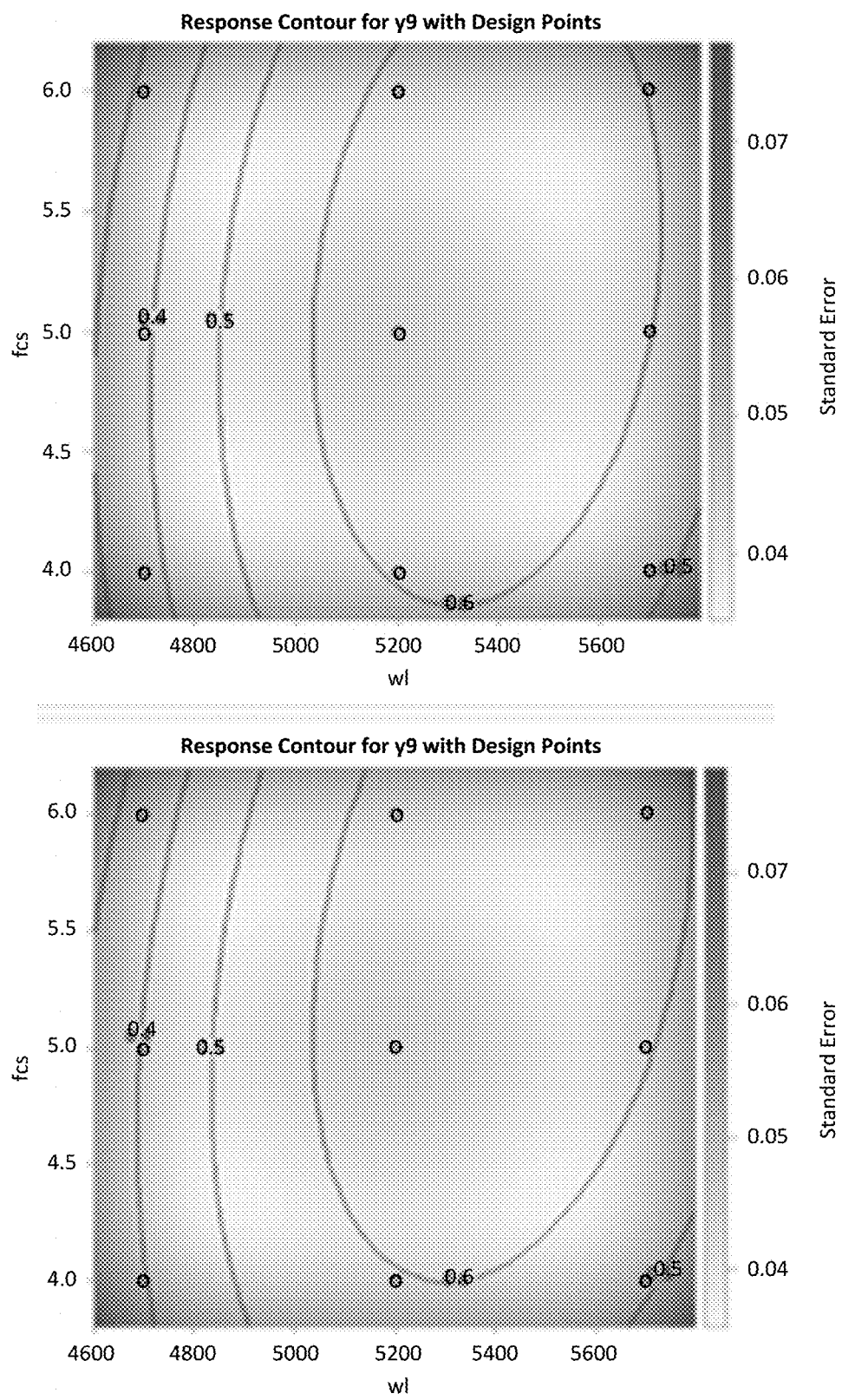
Figure 7C:
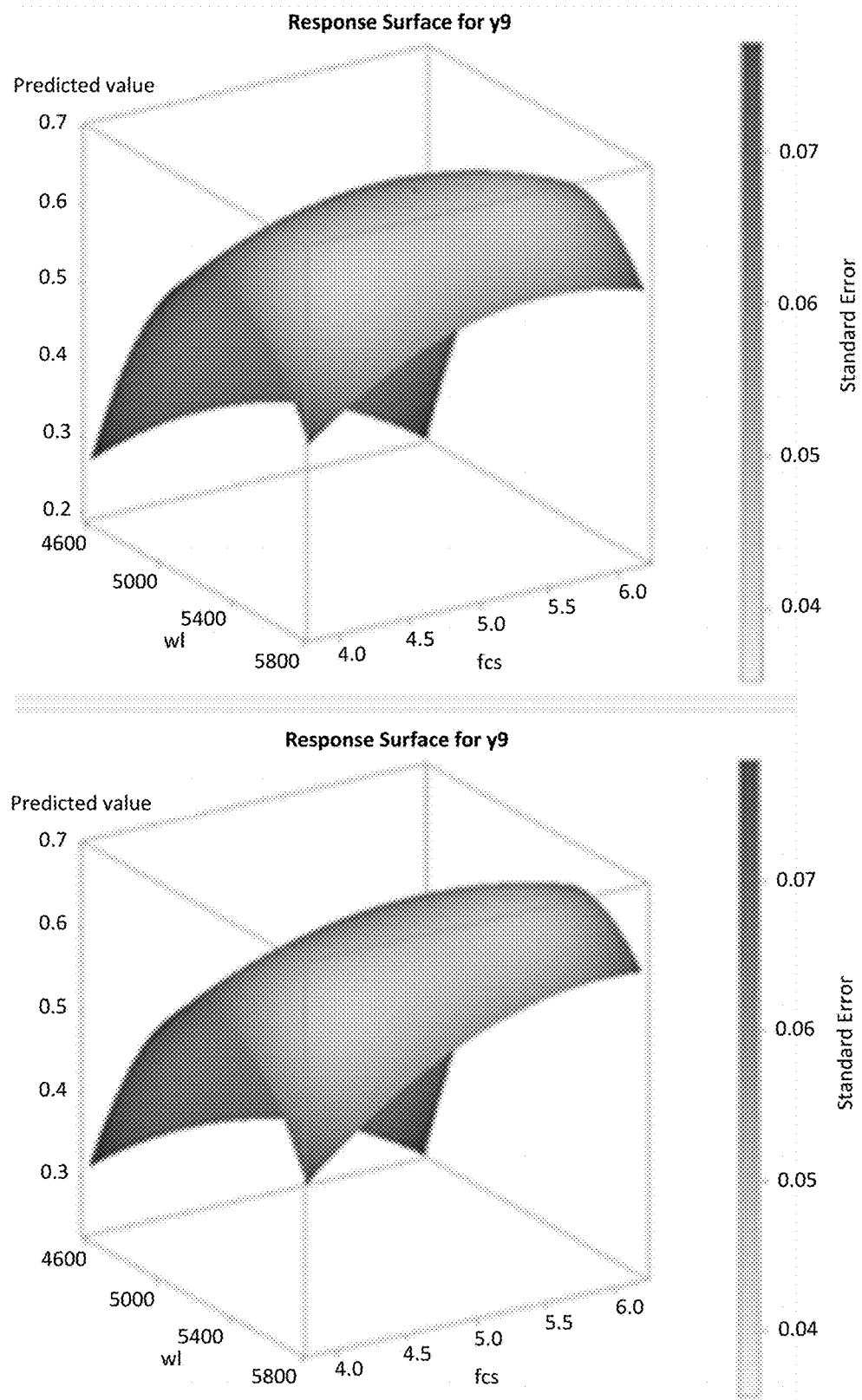

FIGS. 7A-7C represents the response surface for "Factor A"=SB3, "Factor B"=Low, and "Factor C"=Un centered around "Factor D"=5200 and "Factor E"=5. X-axis and Y-axis response surfaces are shown separately. A quadratic model is used in response surface modeling and a lack of fit test for each response surface (not shown) identified that a quadratic model was warranted (i.e., no lack of fit in second order terms) and that each stationary point was at a point of maximum response in that region.

Many of semiconductor manufacturers require that metrology tools measure X and Y simultaneously, and a likely good candidate for dense wafer sampling in phase 2 can be inferred from FIGS. 7A-7C as {"Factor D"=2 "Factor E"=5.3}. Reported eigenvalues and eigenvectors make up the canonical analysis and their magnitude and direction provide useful information regarding sensitivity and surface shape. The sign of the eigenvalues (all negative in the examples shown in FIGS. 7A-7C) indicates that the calculated stationary points are at a maximum and that the composite quality score decreases more in the direction of "Factor D" than in the direction of "Factor E". The actual eigenvalues themselves can only be compared to other candidates' eigenvalues to determine which candidate is least sensitive to process changes given equal scores or given equal overlay residual |m|+3sig. The sensitivity differences could be a new metric itself in the search for the optimum set of operating conditions.

Figure 8:
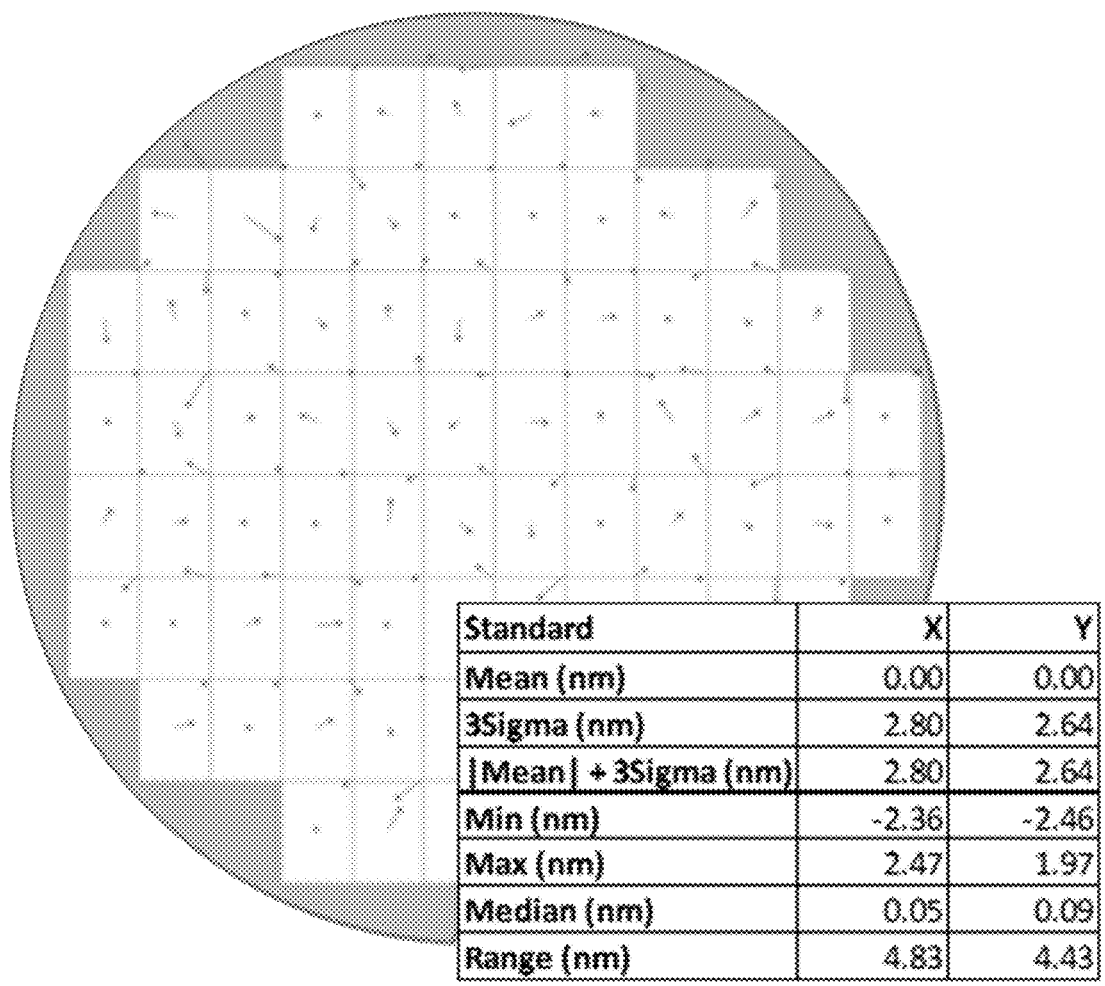
FIG. 8 illustrates exemplary results.

A validation experiment (FIG. 8) on the top candidate set of conditions ("Factor A" design=SB3, "Factor B"=Low, "Factor C"=Un, "Factor D"=2, "Factor E"=5.3) was collected on all sites across the wafer. The results obtained indicated that the first experimental case was successful and that the residual |m|+3sigma is considerably less than the target goal of 4.0 nm. The observed results indicate a |m|+3sigma of 2.8 nm in the X direction and 2.64 in the Y direction of FIG. 8.

A split plot design to identify significant factor combinations allowed for the ability to focus the response surface methodology on a small subset of the whole plot treatment combinations. A single "Factor A" design (SB3), as well as a single "Factor B" (Low NA) were identified as top candidates from the split plot results. LS-Means plots and connecting letters reports proved to be useful aids to validate the results of the type III test of fixed effects and can provide semiconductor manufacturers with the ability to visually inspect the recipe settings that are provided. Response surface modeling centered around candidate "Factor D" and "Factor E" values can lead to measurable candidates for validation testing across the entire wafer.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

While disclosed with semiconductor manufacturing, the embodiments disclosed herein can be used with other types of manufacturing. For example, the techniques disclosed herein can be applied to other manufacturing for electronics, automobiles, chemicals, pharmaceuticals, aircraft, or biomedical devices.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A metrology tool comprising:
an energy source, wherein the energy source generates a beam;
a stage that secures a wafer in a path of the beam from the energy source;
a detector; and
a processor in electronic communication with the detector, wherein the processor is configured to:
receive a plurality of measurements;
determine a plurality of combinations of tool settings on the metrology tool using analysis of variance (ANOVA);
determine candidates from the plurality of combinations;
generate a response surface model for each of the candidates; and
determine a list of the candidates of the tool settings that provide a maximum response and are least sensitive to sources of noise, wherein each of the candidates on the list of the candidates is each from a denser region of the response surface model.

2. The metrology tool of claim 1, wherein the processor is further configured to send instructions to perform the measurements on a semiconductor wafer using the metrology tool.

3. The metrology tool of claim 2, wherein the measurements are collected with a mixed effects model.

4. The metrology tool of claim 1, wherein tunable settings on the metrology tool are independent variables.

5. The metrology tool of claim 1, wherein the list of candidates provide improved performance of the metrology tool relative to a remainder of the candidates.

6. The metrology tool of claim 1, wherein the processor is further configured to determine a score based on measurement quality.

7. The metrology tool of claim 1, wherein the response surface model is a 3×3 response surface model.

8. The metrology tool of claim 1, wherein the processor is further configured to adjust one or more settings on the metrology tool based on the list of candidates.

9. A method comprising:
receiving a plurality of measurements from a metrology tool at a processor;
determining, using the processor, a plurality of combinations of tool settings on the metrology tool using analysis of variance (ANOVA);
determining, using a processor, candidates from the plurality of combinations;
generating, using the processor, a response surface model for each of the candidates; and
determining, using the processor, a list of the candidates of the tool settings that provide a maximum response and are least sensitive to sources of noise, wherein each of the candidates on list of the candidates is each from a denser region of the response surface model.

10. The method of claim 9, further comprising performing the measurements on a semiconductor wafer using the metrology tool.

11. The method of claim 10, wherein the measurements are collected with a mixed effects model.

12. The method of claim 9, wherein tunable settings on the metrology tool are independent variables.

13. The method of claim 9, wherein the list of candidates provide improved performance of the metrology tool relative to a remainder of the candidates.

14. The method of claim 9, further comprising determining a score based on measurement quality.

15. The method of claim 9, wherein the response surface model is a 3×3 response surface model.

16. The method of claim 9, further comprising adjusting, using the processor, one or more settings on the metrology tool using the list of candidates.

17. A non-transitory computer readable medium storing a program configured to instruct a processor to execute the method of claim 9.

* * * * *